(12) United States Patent
Yi et al.

(10) Patent No.: US 6,831,863 B2
(45) Date of Patent: Dec. 14, 2004

(54) ARRAY OF FLASH MEMORY CELLS AND DATA PROGRAM AND ERASE METHODS OF THE SAME

(75) Inventors: Sang Bae Yi, Chungcheongbuk-do (KR); Jae Seung Choi, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 10/412,239

(22) Filed: Apr. 14, 2003

(65) Prior Publication Data

US 2003/0197203 A1 Oct. 23, 2003

Related U.S. Application Data

(62) Division of application No. 09/798,899, filed on Mar. 6, 2001, now Pat. No. 6,580,103.

(30) Foreign Application Priority Data

May 8, 2000 (KR) .......................................... 2000-24375

(51) Int. Cl.[7] .............................................. G11C 16/04
(52) U.S. Cl. .............................. 365/185.29; 365/185.14
(58) Field of Search ........................... 365/185.33, 219, 365/185.29, 185.26, 185.14

(56) References Cited

U.S. PATENT DOCUMENTS

| | | | |
|---|---|---|---|
| 4,868,632 A | | 9/1989 | Hayashi et al. |
| 5,321,699 A | * | 6/1994 | Endoh et al. ........... 365/185.17 |
| 5,687,352 A | * | 11/1997 | Beat ........................... 711/154 |
| 6,160,739 A | * | 12/2000 | Wong ..................... 365/185.29 |
| 6,339,000 B1 | | 1/2002 | Bhattacharya et al. |
| 6,445,617 B1 | | 9/2002 | Sakakibara |

FOREIGN PATENT DOCUMENTS

JP 2-103965 A 4/1990

* cited by examiner

*Primary Examiner*—Thong Q. Le
(74) *Attorney, Agent, or Firm*—Birch, Stewart, Kolasch & Birch, LLP

(57) ABSTRACT

The present invention relates to an array of flash memory cells whose unit cell includes a single transistor of MONOS/SONOS structure (Metal/poly-Silicon Oxide Nitride Oxide Semiconductor) and to data programming and erasing using the same. The array of the flash memory cells includes a plurality of flash memory cells arranged in a form of a matrix. The matrix includes a plurality of word lines arranged in one line direction and connected to gates of the flash memory cells is a row, a plurality of selection lines arranged in a direction perpendicular to the word lines and connected to the sources of the flash memory cells arranged in a column, and a plurality of bit lines arranged in a direction parallel to the selection lines and connected to the drains of the flash memory cells of the same column. To program and erase the cells, different biasing conditions are applied to the word lines, selection lines, bit lines, and the wells of the transistors.

7 Claims, 11 Drawing Sheets

FIG.6

| MODE | $V_{W/L}$ | $V_{S/L}$ | $V_{B/L}$ | $V_{WELL}$ |
|---|---|---|---|---|
| PROGRAM | $V_{cc}$ | $-V_{pp}$ | $-V_{pp}$ | $-V_{pp}$ |
| Program Inhibit1 | $V_{cc}$ | GND | GND | $-V_{pp}$ |
| Program Inhibit2 | GND | $-V_{pp}$ | $-V_{pp}$ | $-V_{pp}$ |
| Erase | $-V_{pp}$ | $V_{cc}$ | $V_{cc}$ | $V_{cc}$ |
| Read | $V_{cc}$ | GND | $V_{dd}$ | GND |

ARRAY OF FLASH MEMORY CELLS AND DATA PROGRAM AND ERASE METHODS OF THE SAME

This application is Divisional of application Ser. No. 09/798,899, filed Mar. 6, 2001 now U.S. Pat. No. 6,580,103.

BACKGROUND OF THE PRESENT INVENTION

1. Field of the Present Invention

The present invention relates to a semiconductor memory device, and more particularly to an array of flash memory cells, in which a unit cell includes a single transistor and to methods for programming and erasing the same.

2. Discussion of the Related Art

An ideal memory element allows for easy programming (writing), easy erasing, and retains a memory state even if power is removed, i.e., is nonvolatile. Nonvolatile semiconductor memories (NVSM) are classified into two types—a floating gate type and a metal insulator semiconductor (MIS) type. The MIS type also may have two or more kinds of stacked dielectric films.

The floating gate type memory uses a potential well to implement memory functions. ETOX (EPROM Tunnel Oxide) structure, which has recently been the most applicable technology for the flash EEPROM (Electrically Erasable Read Only Memory), is typical of the floating gate type. The floating gate type structure can be used to implement a memory cell using a single transistor.

On the other hand, the MIS type memory function uses traps formed in a dielectric film bulk, a boundary layer between two dielectric films, or a boundary layer between a dielectric film and a semiconductor. The MONOS/SONOS (Metal/Poly Silicon Oxide Nitride Oxide Semiconductor) structure, which is used as a full-featured EEPROM, is typical.

To execute the program and erase operations in these memory cells, it is essential that selection transistors be included in addition to the transistors of MONOS/SONOS structure. In other words, each memory cell must include at least two transistors.

The array of conventional flash memory cells and the methods for programming and erasing the same are explained in detail by referring to the accompanying drawings FIGS. 1–2B. As seen in FIG. 1, a unit cell of the conventional flash memory cells includes two transistors.

FIG. 2A shows an array of conventional flash memory cells using the cell in FIG. 1 as the unit cell, and bias conditions for programming the cells. FIG. 2B shows the array of conventional flash memory cells using the cell in FIG. 1 as a unit cell and the bias conditions for erasing the cells.

As seen, the array of conventional flash memory cells is constructed by arranging unit cells in a form of matrix. Each cell includes two transistors—a memory transistor having a MONOS/SONOS structure and a selection transistor for determining whether the cell is selected or not.

A plurality of word lines are constructed in a direction so that the gates memory transistors arranged in a row are commonly connected.

A plurality of word selection lines are constructed in a direction parallel to the word lines so that the gates of selection transistors arranged in a row are commonly connected.

A plurality of bit lines are constructed in a direction perpendicular to the word lines so that the drains of memory transistors arranged in a column are commonly connected.

A plurality of bit selection lines are constructed in a direction parallel to the bit lines so that the drains of selection transistors arranged in a column are commonly connected.

As mentioned above, the conventional unit cell includes a memory transistor having the MONOS/SONOS structure and a selection transistor. A cell is selected by selecting the selection transistor, and program and erase operations are performed on the associated memory transistor.

As shown in FIG. 1, the memory transistor has an ONO (Oxide Nitride Oxide) structure including a first oxide film 11, a nitride film 12, and a second oxide film 13 sequentially stacked on a portion of a semiconductor substrate 10. A first gate electrode 15a is formed on the oxide film 13.

The selection transistor includes a gate oxide film 14 and a second gate electrode 15b formed on the gate oxide film 14. The gate oxide film 14 of the selection transistor is thicker than the first and second oxide films 11 and 13 so that a portion of the selection transistor is isolated from the first gate electrode 15a.

A common source region 16a is formed in a portion of the semiconductor substrate 10 between the memory transistor and the selection transistor. Drain regions 16b are formed in portions of the semiconductor substrate 10 at the outside of the memory and selection transistors.

In the conventional flash memory cell, programming is accomplished by applying a high positive voltage to the first gate electrode 15a. When the high voltage is so applied, electrons from the semiconductor substrate 10 tunnel through the first oxide film 11 and are injected into the nitride film 12. Thus, the first oxide film 11 is called a tunneling oxide.

The second oxide film 13 prevents electrons injected into the nitride film 12 from leaking into the first gate electrode 15a. The second oxide film 13 also prevents electrons from being injected from the first gate electrode 15a into the nitride film 12. Thus, the second oxide film 13 is called a blocking oxide.

Since the program operation uses traps in the boundary layer between the nitride film 12 and the second oxide film 13, electrons should be injected into or emitted from the entire region of a substrate channel to perform the program and erase operations.

When performing a programming operation, the array of cells is biased in a certain manner. The programming bias condition for the array of conventional flash memory cells is explained as follows.

Referring to FIG. 2A, a unit cell, among the plurality of flash memory cells, is selected for programming. Thereafter, a voltage Vp is applied to the word line connected to the gate of the selected memory transistor. Vp is also applied to the word selection line connected to the gate of the selection transistor of the selected cell. Due to the arrangement, the gates of memory transistors and selection transistors of other cells in the same row are also applied with the same Vp voltage.

However, a ground voltage is applied to the word lines of the non-selected rows. Also, the word selection lines of the non-selected rows have their voltages left floating.

For the bit line connected to a drain of the selected memory transistor, the ground voltage is applied. However, for the non-selected bit lines, a voltage Vi is applied. Similarly, for the bit selection line connected to the drain of the selected selection transistor, voltage is left floating, while the non-selected bit selections lines have ground voltages applied.

Finally, ground voltage is also applied to the well (semiconductor substrate) at the lower portion of all the cells regardless of whether that cell is selected or not. The aforementioned bias conditions are simultaneously applied.

Table 1 describes the bias conditions for the programming operation in a table form.

TABLE 1

|  | word line | word selection line | bit line | bit selection line | well |
|---|---|---|---|---|---|
| Selected | Vp | Vp | Ground | Float | Ground |
| Not selected | Ground | Float | Vi | Ground | Ground |

Note that multiple cells maybe be selected at a time for programming, such as a byte at a time.

When performing an erasing operation, the array of cells is differently biased from the programming operation. The erasing bias condition for the array of conventional flash memory cells is explained as follows.

Referring to FIG. 2B, a unit cell is selected for erasing. Thereafter, the ground voltage is applied to the word line connected to the gate of the selected memory transistor. Also, Vp is applied to the word selection line connected to the gate of the selection transistor of the selected cell.

However, for the non-selected word lines, voltage Vp is applied, while the word selection lines are left floating.

For the bit line connected to a drain of the selected memory transistor, the ground voltage is applied. However, for the non-selected bit lines, a voltage Vi is applied. Similarly, for the bit selection line connected to the drain of the selected selection transistor, voltage is floating, while the non-selected bit selection lines have ground voltages applied.

Finally, as in the programming operation described above, ground voltage is applied to the well (semiconductor substrate) at the lower portion of all the cells regardless of whether that cell is selected or not. The aforementioned bias conditions are simultaneously applied.

The table 2 describes the bias conditions for the erasing operation in a table form.

TABLE 2

|  | word line | word selection line | bit line | bit selection line | well |
|---|---|---|---|---|---|
| Selected | Ground | Vp | Ground | Float | Ground |
| Not selected | Vp | Float | Vi | Ground | Ground |

Again, multiple cells may be selected for erasing, such as a byte at a time.

The array of conventional flash memory cells and the program and erase methods using the same have the following problems. First, because two transistors are used for a single cell, the area for a chip becomes large and it is difficult to isolate cells from each other. Second, programming the chip is complex.

SUMMARY OF THE PRESENT INVENTION

It is therefore an object of the present invention to improve the integrity of a chip by using a single transistor for a single cell.

It is another object of the present invention to easily implement the program operation by the byte and the erase operation in bulk by providing an array whose single cell comprises a single transistor.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the purpose of the present invention, as embodied and broadly described, an array of flash memory cells according to the present invention comprises a plurality of flash memory cells, each of the cells having a MONOS/SONOS structure and being arranged in the form of a matrix, a plurality of word lines arranged in one line direction so that the gates of the flash memory cells arranged in one and the same row are commonly connected, a plurality of selection lines arranged in a direction perpendicular to the word lines so that the sources of the flash memory cells arranged in one and the same column are commonly connected, and a plurality of bit lines arranged in a direction parallel to the selection lines so that the drains of the flash memory cells arranged in one and the same column are commonly connected.

A data program method using the array of the flash memory cells according to the present invention, in a plurality of word lines, selection lines and bit lines respectively connected to the gates, sources and drains of a plurality of flash memory cells arranged in the form of a matrix and wells formed in the lower portion of each of the flash memory cells, comprises a first step for selecting one cell among a plurality of the flash memory cells; a second step for applying a power supply voltage Vcc to the word line connected to the gate of the selected cell and a voltage −Vpp to the well in the lower portion of the selected cell and to the selection and bit lines connected to the source and drain of the selected cell; a third step for performing the second step and at the same time applying a ground voltage to the selection and bit lines of the cells connected to the same word line as the selected cell and a voltage −Vpp to the wells; and a fourth step for performing the first and second steps and at the same time applying a ground voltage to the word lines of the cells not connected to the same word line as the selected cell and a voltage −Vpp to the wells and to the selection and bit lines of the cells not connected to the same word line as the selected cell.

A data erase method using the array of the flash memory cells according to the present invention, in a plurality of word lines, selection lines and bit lines which are connected, respectively, to the gates, the sources and the drains of a plurality of flash memory cells arranged in the form of a matrix and wells formed in the lower portion of each of the flash memory cell, comprises a first step for applying a voltage −Vpp to the word lines of the cells and a second step for performing the first step and at the same time applying a power supply voltage Vcc to the selection and bit lines of the cells and to the wells in the lower portion of the cells.

Other objects, features, and advantages of the present invention will be apparent from the accompanying drawings and from the detailed description that follows.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

In the drawings:

FIG. 6 is a table showing bias conditions applied to the cells of the array in FIG. 3 for programming, erasing, and reading operations;

DETAILED DESCRIPTION OF THE PREFERRED EMBODIMENT

An array of the flash memory cells according to an embodiment of the present invention and the data programming and erasing operations using the same are explained in detail by referring to the accompanying drawings.

The array of the flash memory cells according to the present invention includes a unit cell having a single transistor of a MONOS/SONOS (Metal/Silicon Oxide Nitride Oxide Semiconductor) structure. The unit cell is used as a flash memory cell having a flash EEPROM in which 1 Giga FET's (Field Effect Transistors) structure is included.

Figure 1:
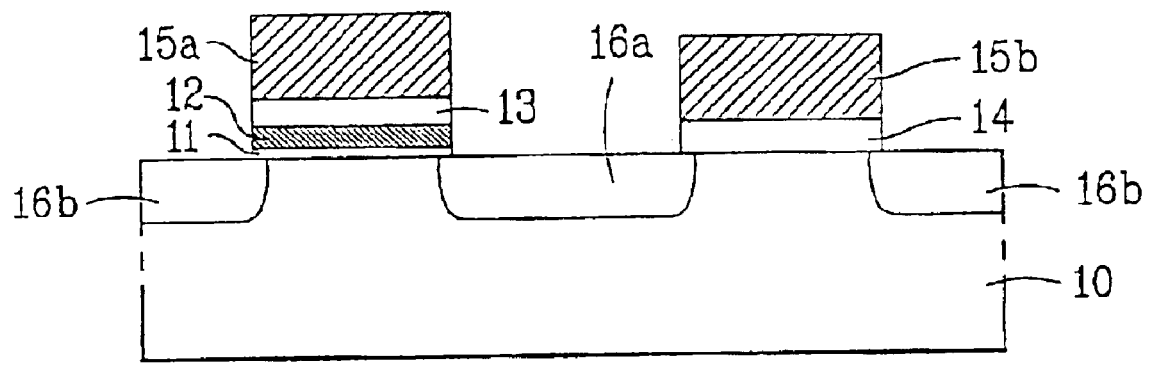
FIG. 1 is a sectional view showing the structure of a conventional flash memory cell, which includes two transistors in a single cell.
Figure 2A:
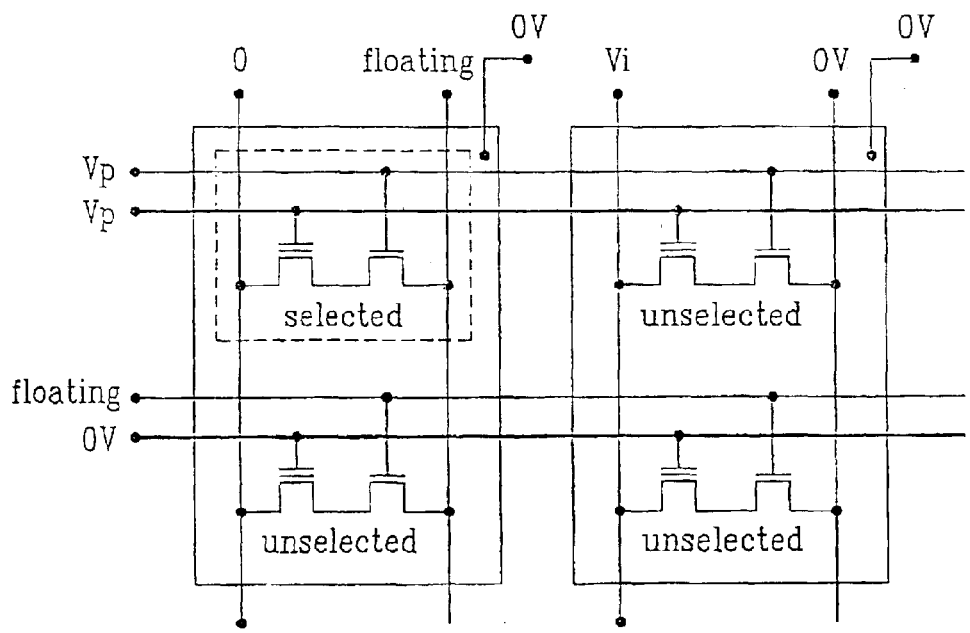
FIG. 2A shows a conventional array of flash memory cells using the cell in FIG. 1 as the unit cell, and a bias condition for programming the cells.
Figure 2B:
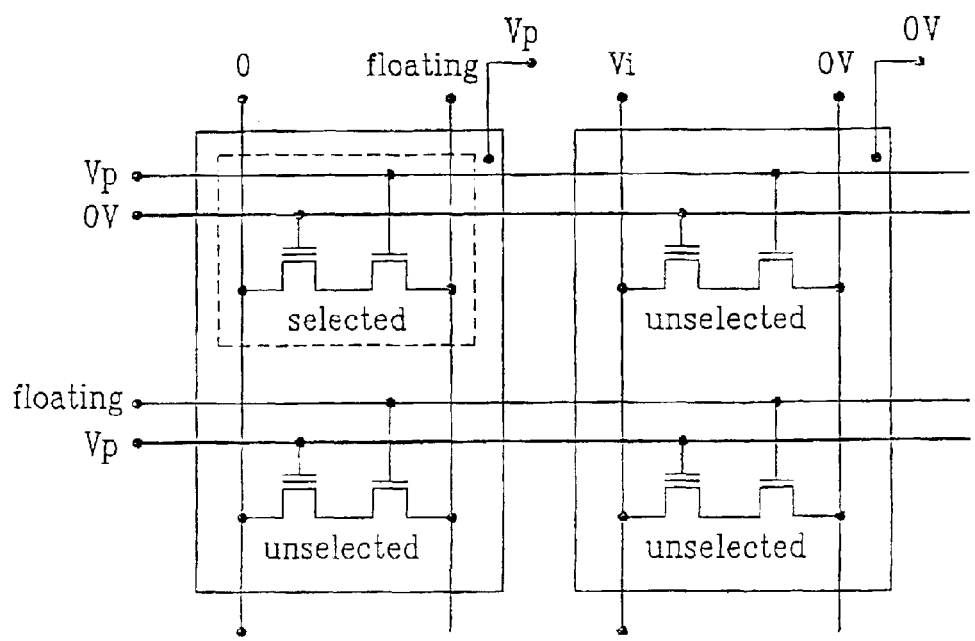
FIG. 2B shows the conventional array of flash memory cells using the cell in FIG. 1 as a unit cell and a bias condition for erasing the cells.
Figure 3:
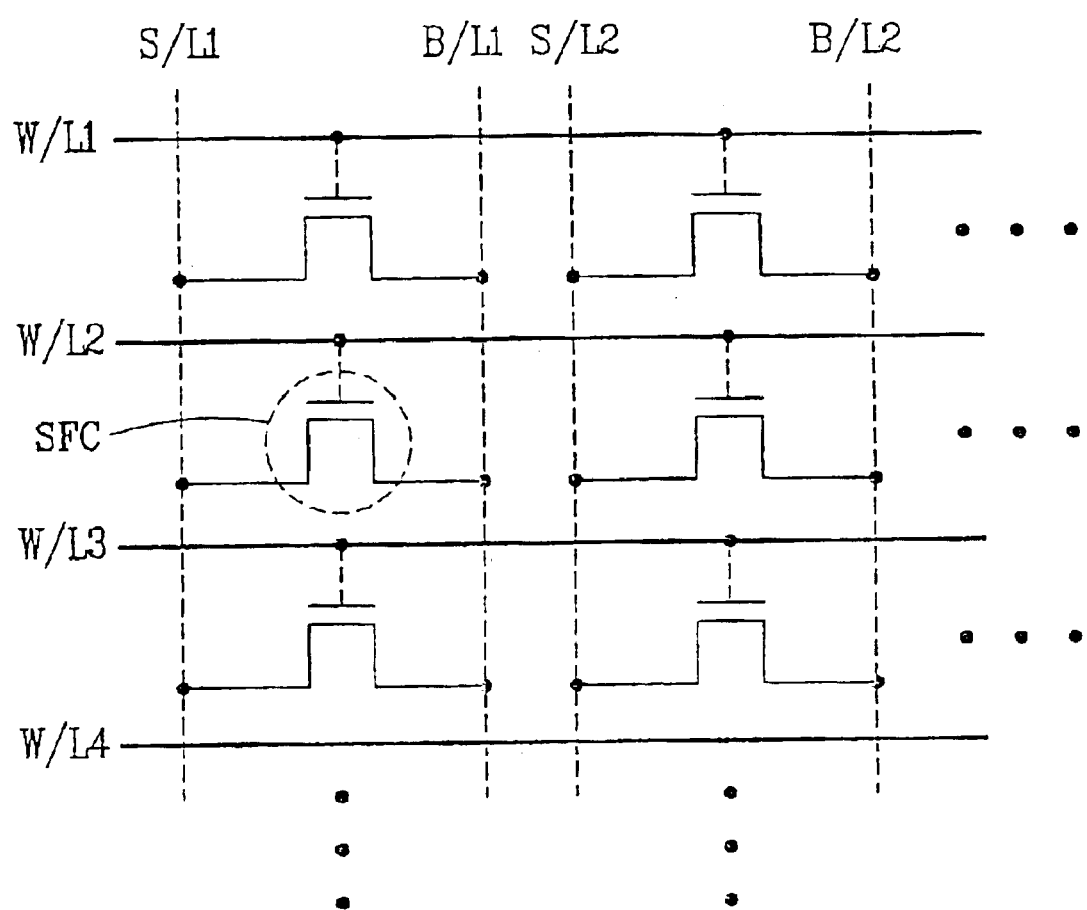
FIG. 3 is an array of flash memory cells according to an embodiment of the present invention.

The array of the flash memory cells according to the present invention, as shown in FIG. 3, includes a plurality of flash memory cells, which are of NOR type, arranged in a matrix form. The matrix includes a plurality of word lines W/L1, W/L2, W/L3, W/L4, etc., in one direction; a plurality of bit lines B/L1, B/L2, B/L3, etc., in a direction perpendicular to the word lines; and a plurality of selection lines S/L1, S/L2, S/L3, etc., in a direction parallel to the bit lines.

Each word line connects gates of the flash memory cells in a common row. Each bit line connects drains of the flash memory cells in a common column. Further, each selection line connects the sources of the flash memory cells arranged in a common column.

Figure 4:
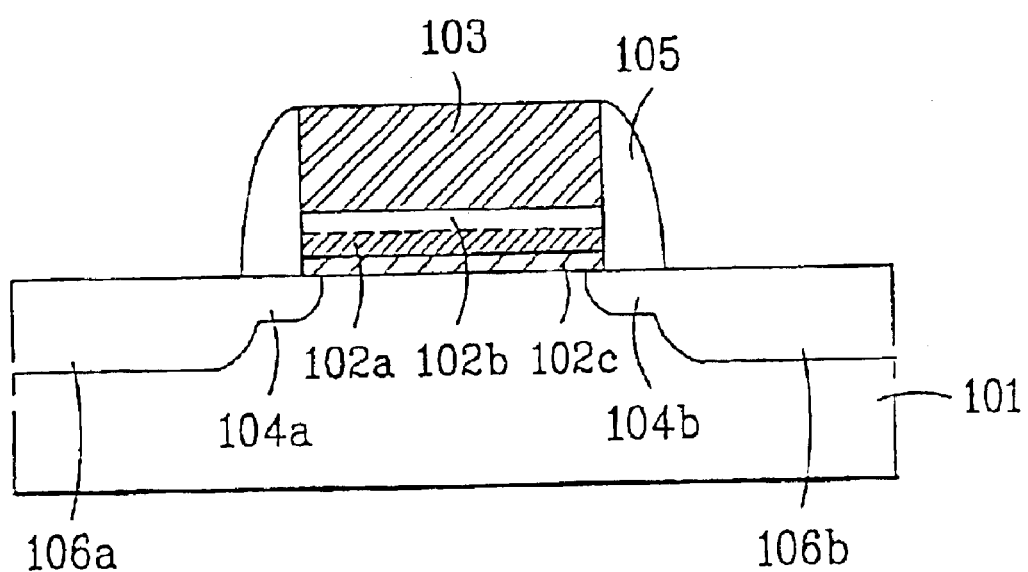
FIG. 4 is a sectional view showing the structure of a flash memory cell that is a basic unit of the array in FIG. 3.

The structure of a unit cell of the array of flash memory cells is shown in FIG. 4. As shown, a third silicon oxynitride film 102c, a first silicon oxynitride film 102a, and a second silicon oxynitride film 102b are stacked to form an ONO (Oxide/Nitride/Oxide) structure over a portion of semiconductor substrate 101. The first silicon oxynitride film 102a contains more nitrogen than the second and third silicon oxynitride films 102b and 102c.

A gate electrode 103 is formed on the second silicon oxynitride film 102b. Sidewall spacer 105 is formed on each side of the third silicon oxynitride film 102c, the first silicon oxynitride film 102a, the second silicon oxynitride film 102b, and the gate electrode 103.

A lightly doped source and drain regions 104a and 104b, respectively, are formed in the semiconductor substrate 101 below the sidewall spacer 105. Also in the semiconductor substrate 101, heavily doped source and drain regions 106a and 106b are formed outside the lightly doped source and drain regions 104a and 104b, respectively. As seen, the heavily doped regions are deeper than the then lightly doped regions.

The flash memory cell can be either NMOS or PMOS.

Figure 5A:
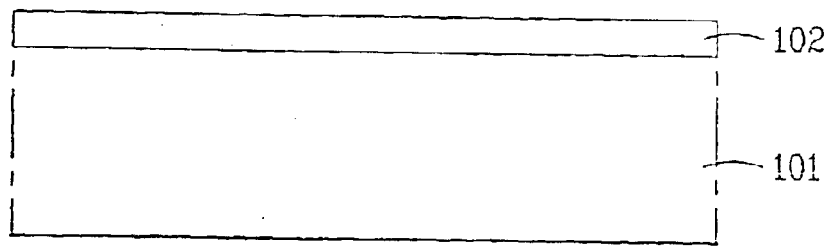
FIGS. 5A to 5E are sectional views showing a process for fabricating the flash memory cell depicted in FIG. 4.

A process for fabricating the flash memory cell are depicted in FIGS. 5A to FIG. 5E. First, as shown in FIG. 5A, a silicon oxide film 102 is formed over the semiconductor substrate 101 by a chemical vapor deposition method or a thermal oxidization process.

Figure 5B:
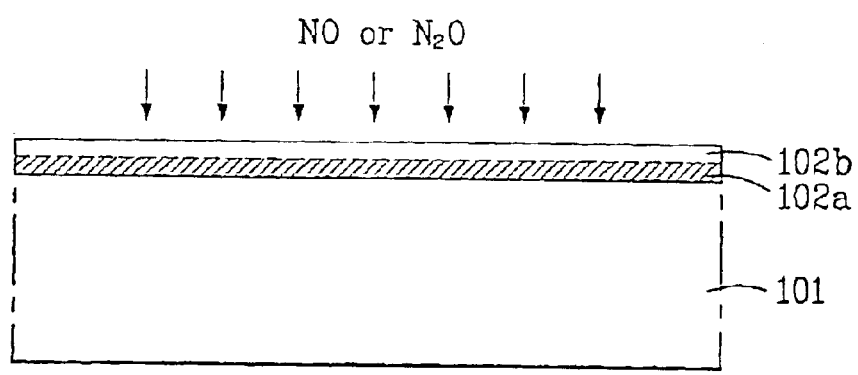

Next, as shown in FIG. 5B, an annealing process is performed in a NO or $N_2O$ gas atmosphere. This generates the first silicon oxynitride film 102a and the second silicon oxynitride film 102b. Annealing is performed such that the first silicon oxynitride film 102a, adjacent to the silicon substrate 101, contains more nitrogen than the second silicon oxynitride film 102b.

Figure 5C:
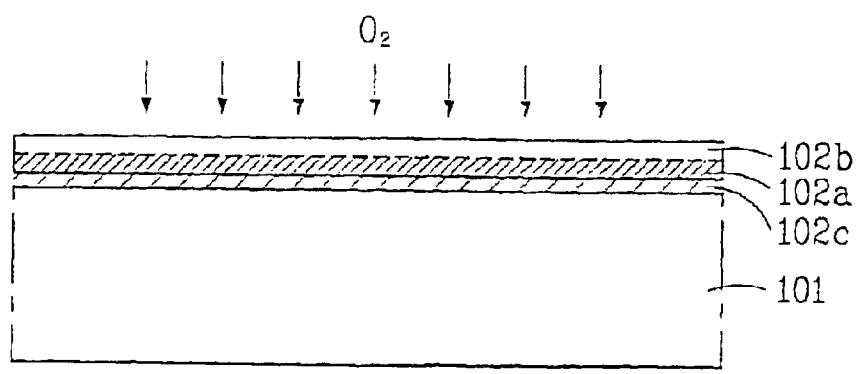

Referring to FIG. 5C, a reoxidation process is performed in an oxygen gas atmosphere. The oxygen penetrates to create the third silicon oxynitride film 102c. As a result, the third silicon oxynitride film 102c contains relatively low level concentration of nitrogen. Thus, the second, first, and third silicon oxynitride films 102b, 102a, and 102c forms an Oxide Nitride Oxide structure.

Figure 5D:
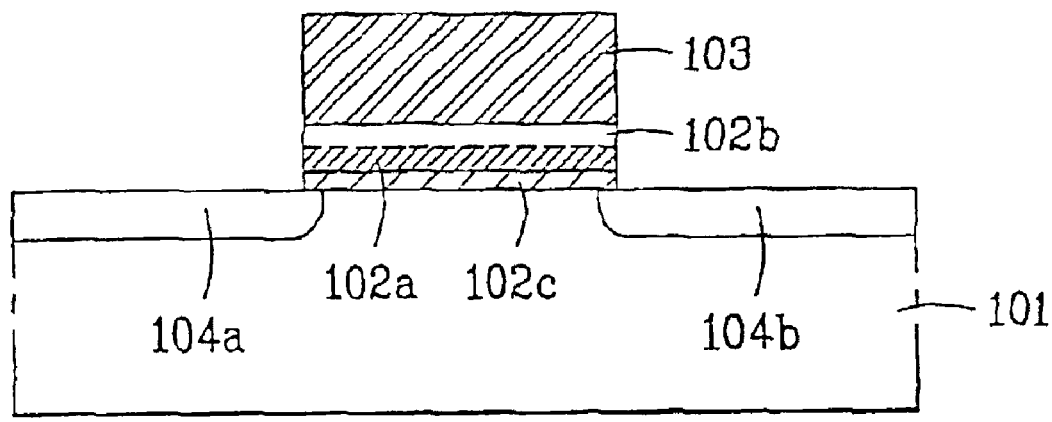

Then a polysilicon layer is deposited on the entire surface. Thereafter, the polysilicon layer, the second silicon oxynitride film 102b, the first silicon oxynitride film 102a, and the third silicon oxynitirde film 102c are anisotropically etched in sequence to form the gate structure, as shown in FIG. 5D using a gate forming mask. The remaining polysilicon layer becomes the gate electrode 103.

Next, low concentration impurity ions are injected into the semiconductor substrate 101 at both sides of a gate electrode 103 so that lightly doped source and drain regions 104a and 104b, respectively, are formed at each side of the gate electrode 103.

Figure 5E:
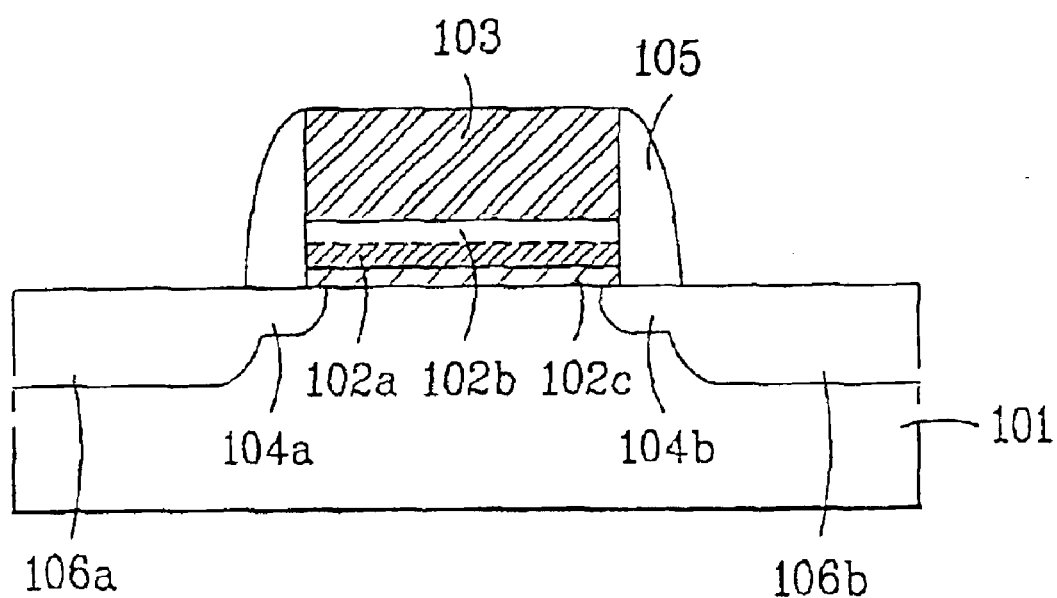

Then, as shown in FIG. 5E, an oxide film is deposited on the entire surface of the semiconductor substrate 101 as well as the gate electrode 103 and thereafter is etched back so that a sidewall spacer 105 is formed at each side of the gate structure.

Thereafter, high concentration impurity ions are injected into the semiconductor substrate 101 using the gate electrode 103 and the sidewall spacer 105 as a mask. This forms the heavily doped source and drain regions 106a and 106b and completes the fabrication process.

The array of flash memory cells are programmed and erased by applying appropriate biasing conditions to select cells for programming and erasing. Also, non-selected cells are isolated from being programmed or erased by applying appropriate inhibiting conditions. With reference to FIGS. 3 and 6, methods for programming and erasing the cells of the array are explained below.

In the embodiment of the present invention, the programming and erasing operations are performed through the entire substrate channel region by quantum-mechanical tunneling effect. The programming operation may be performed by the byte and the erase operation may be performed by the bulk of chip or the block. In other words, multiple cells can be programmed (written) or erased simultaneously.

FIG. 6 is a table depicting the biasing conditions necessary for programming and erasing a cell as well as reading from a cell. The table also includes inhibiting conditions to isolate a cell from being programmed or erased.

The data programming method and the bias conditions necessary for programming the array are explained as follows. Programming is accomplished by changing the threshold voltage of the unit cell transistor. For example, the threshold voltage may be raised to some high level during the programming operation.

A flash memory cell to be programmed is selected by applying appropriate signals to the corresponding word line, selection line, bit line, and the well of the cell transistor. As shown in the table of FIG. 6, to select a cell, voltages Vcc, –Vpp, –Vpp, and –Vpp are applied to the corresponding word line, selection line, bit line, and the well.

In the example shown in FIG. 3, Vcc is applied to the word line W/L2 and –Vpp is applied to selection line S/L1, bit line B/L1, and the well (semiconductor substrate) which results in selecting the selected flash memory cell (SFC, marked by a dashed circle).

Note that multiple cells can be selected at once. For example, if the word line W/L3 has the voltage Vcc applied, then the transistor immediately below the SFC would be programmed as well.

Also, in the aforementioned structure, a well is formed in a lower portion of each flash memory cell. Thus "well" will be used instead of the semiconductor substrate 101.

While the first step is performed, the non-selected cells must be isolated so that they are not programmed. For the non-selected cells that are on the same row as the selected cell (or cells), the corresponding selection and bit lines are both driven to ground voltage. This is depicted as Program Inhibit1 in FIG. 6. Because these cells receive the same word line signal as the selected cell, these non-selected cells are in the "first program inhibit region".

For the non-selected cells that are on the same column as the selected cell (or cells), the corresponding word line is driven to ground voltage. This is depicted as Program Inhibit2 in FIG. 6. Because these cells receive different word line signal than the selected cell, these non-selected cells are in the "second program inhibit region".

Note that for non-selected cells that are neither on the same row or column as the selected cell, these cells are isolated due to ground voltage being applied to all of the corresponding word lines, bit lines, and selections lines. These non-selected cells are also in the second program inhibit region since they receive different word line signal than the selected cell.

By applying the appropriate bias conditions to each word line, bit line, selection line and the well, the programming operations for the array of flash memory cells are executed.

The data erasing method and the bias condition necessary for erasing the array are explained as follows. Erasing is also accomplished by changing the threshold voltage of the unit cell transistor. For example, the threshold voltage may be lowered to some low level during the erasing operation.

As noted previously, erasing may be performed in bulk, i.e., multiple cells may be erased simultaneously. Erasing is accomplished by applying the voltage –Vpp to a word line or multiple word lines and by applying the supply voltage Vcc to appropriate selection lines, bit lines, and wells.

When reading from SFC, the corresponding bias condition applied is as follows. The supply voltage is applied to the word line of the SFC, ground voltage is applied to the selection line and the well, and voltage Vdd is applied to the bit line.

Hereafter, referring to FIG. 7 through FIG. 11, the characteristics of each flash memory cell according to the aforementioned bias conditions are explained.

Figure 7:
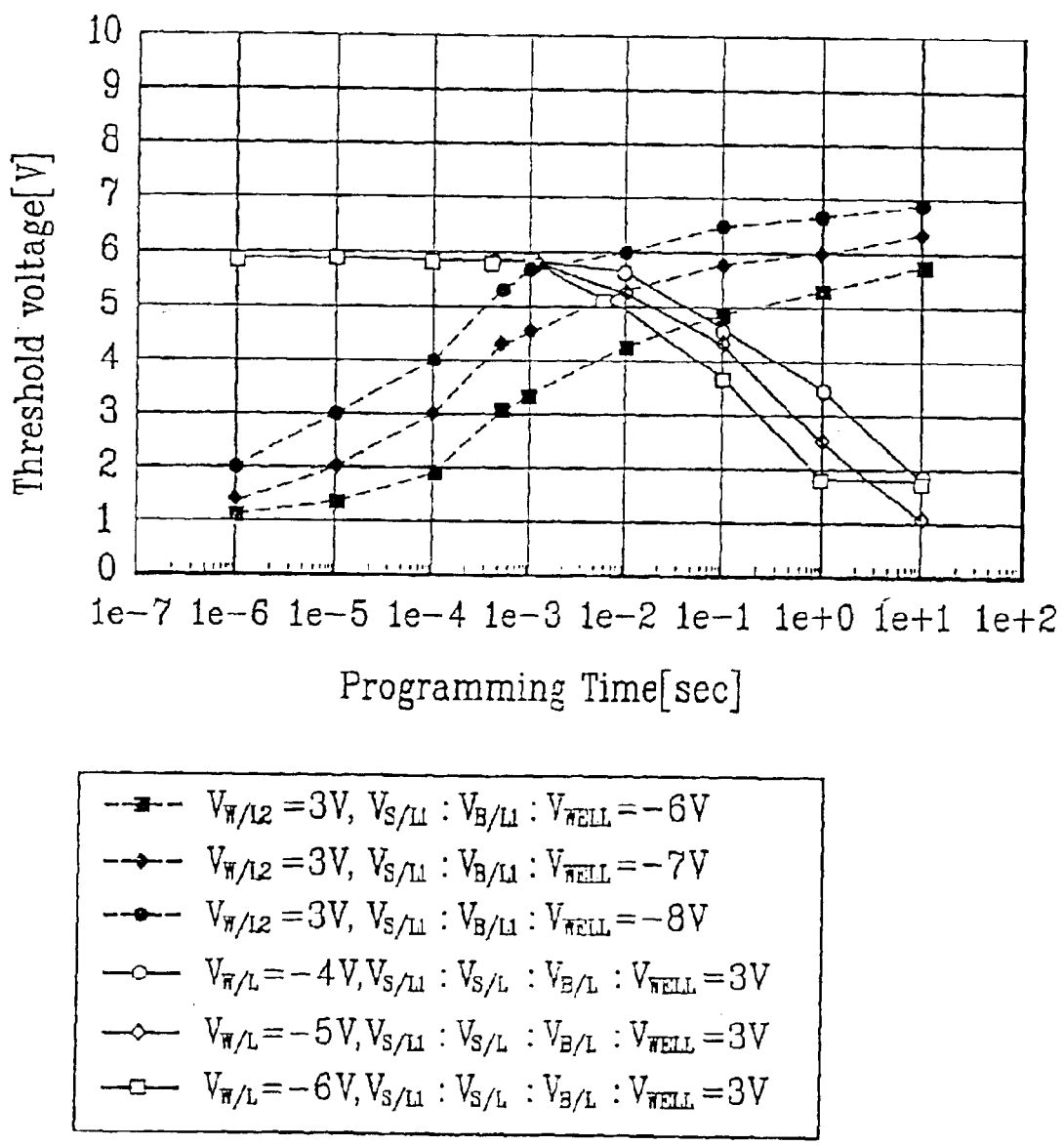
FIG. 7 shows the threshold voltage characteristics of the selected cells for the programming and erasing operations to which the bias conditions as depicted in FIG. 6 are applied.

FIG. 7 shows the threshold voltage characteristics of the selected cell (or cells) for the programming and erasing operations to which the bias conditions as depicted in FIG. 6 are applied. For both the programming and erasing operations, three voltage characteristics for each are shown.

As noted previously, a cell is selected for programming by applying Vcc to the word line connected to the gate of the SFC (see FIG. 3), and by applying –Vpp to the selection line, bit line, and the well of the SFC. In FIG. 7) Vcc is 3V applied to the word line. Also, three characteristic lines are shown for the cases where –Vpp is –6, –7, and –8V applied to the appropriate selection line, bit line, and the well.

It is noted that in all cases, as the amount of programming time is increased, the threshold voltage of the SFC is also increased.

It is also noted that lower the –Vpp voltage (more negative), the threshold voltage of the SFC is increased faster. This denotes that the programming time can be shortened by increasing the magnitude of the –Vpp voltage.

Next, the voltage characteristic for the erase operation is explained. It was noted above that the SFC is erased by applying –Vpp to the word line connected to the gate of the SFC, and by applying the supply voltage Vcc to the selection line, bit line, and the well of the SFC. In FIG. 7, Vcc is 3V applied to the appropriate selection line, bit line, and well. Also, three characteristic lines are shown for the cases where –Vpp is –4, –5, and –6V applied to the appropriate word line.

It is noted that in all cases, as the amount of erasing time is increased, the threshold voltage of the SFC is decreased.

It is also noted that lower the –Vpp voltage (more negative), the threshold voltage of the SFC is decreased faster. This denotes that the erasing time can be shortened by lowering the –Vpp voltage.

Figure 8:
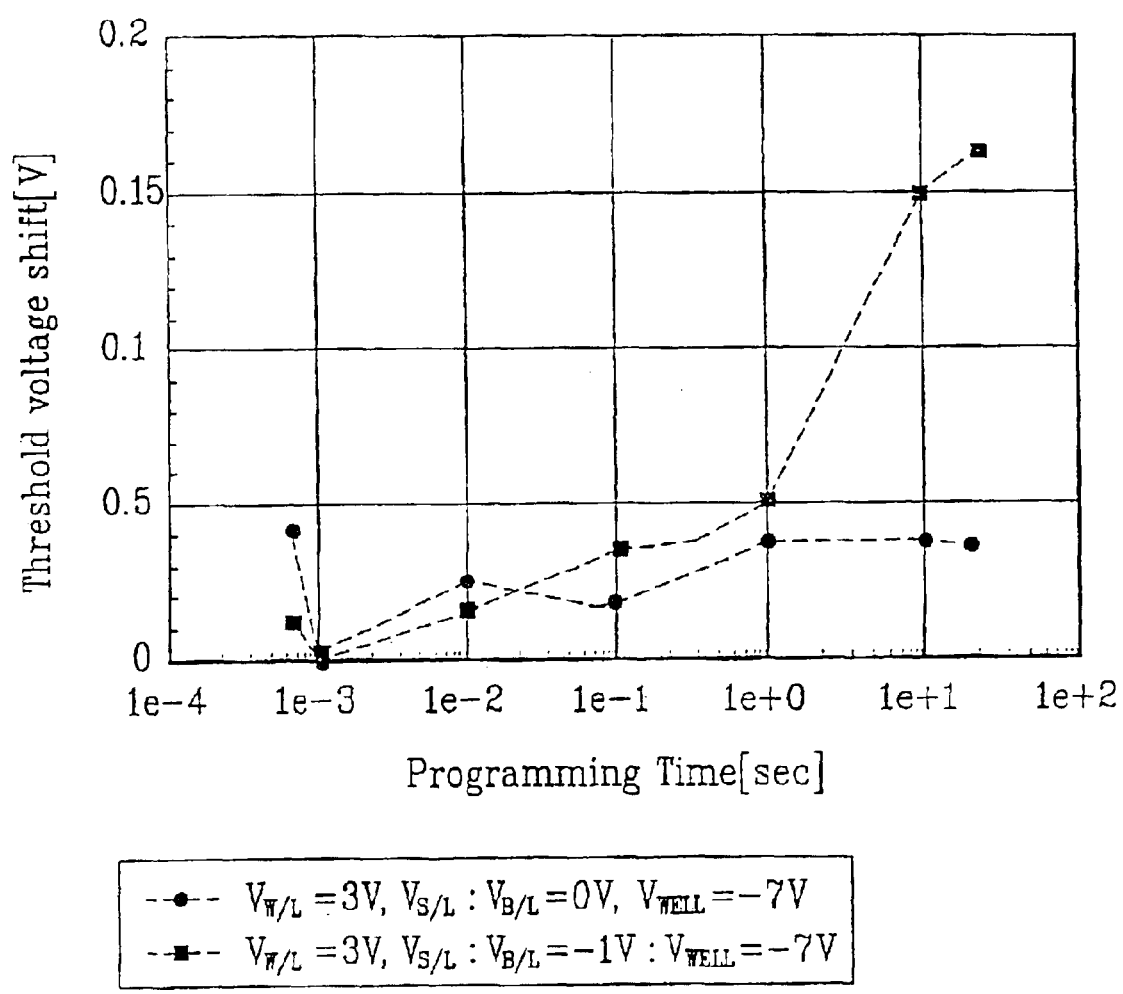
FIG. 8 shows the threshold voltage characteristics of the non-selected cells during programming.

FIG. 8 shows the threshold voltage characteristics of the non-selected cells during programming. These are the characteristics of the cells that have been isolated by applying the Program Inhibit1 bias condition depicted in the table of FIG. 6 during programming of the SFC. In other words, the these are the voltage characteristics of the cells in the first program inhibit region.

As mentioned previous, Program Inhibit1 isolation is achieved by applying the supply voltage Vcc to the appropriate word line, applying an intermediate voltage, such as ground, to the appropriate selection and bit lines, and applying –Vpp to the well.

In FIG. 8, characteristic lines for two cases are shown. In the both cases, Vcc is 3V and –Vpp is –7V. However, the intermediate voltage is 0V in the first case and is –1V in the second case.

It is noted that when ground voltage is applied to the selection and the lines, the threshold voltage of the cells in the first program inhibit region does not exceed 0.05 V, even after 10 seconds (1e+1) of programming the SFC has elapsed. Even when −1V is applied to the selection and the lines, the threshold voltage of the cells in the first program inhibit region does not exceed 0.15V after 10 seconds.

Thus in both cases, the cells in the first program inhibit region, the cells that are most susceptible to unwanted programming, are not programmed. Therefore, it can be stated with confidence that the isolation is effective.

Figure 9:
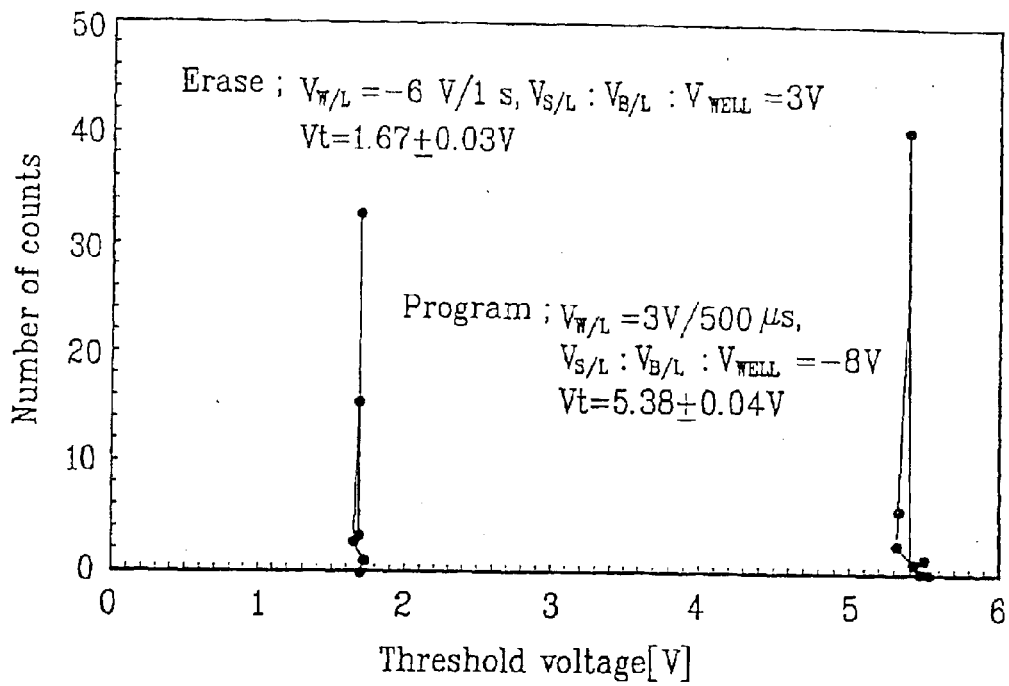
FIG. 9 shows the distribution of threshold voltage of programmed cells and erased cells.

FIG. 9 shows the distribution of threshold voltage of programmed cells and erased cells in which the cells have undergone multiple programming and erasing cycles.

As shown, for the programmed cells, the threshold voltage Vt is 5.38±0.04V. The biasing condition for this is where Vcc of 3V is applied to the word line (for 500 $\mu$s) and −Vpp of −8V is applied to the selection and bit lines and the well, and the cell has undergone programming operation 40 times. The threshold voltages are tightly distributed around 5.38V and seemingly form a Delta function.

For the erased cells, the threshold voltage Vt is 1.67±0.03V. The biasing condition for this is where −Vpp of −6V is applied to the word line (for 1 second) and Vcc of 3V is applied to the selection and bit lines and the well, and the cell has undergone erasing operation 30 times. Again, the threshold voltages are tightly distributed around 1.67V and seemingly form a Delta function.

Thus, as shown, the threshold voltages for the programmed state and the erased state are stable and constant for the flash memory cell with the MONOS/SONOS structure according to the embodiment of the present invention, despite many repeated programming and erasing operations.

Figure 10:
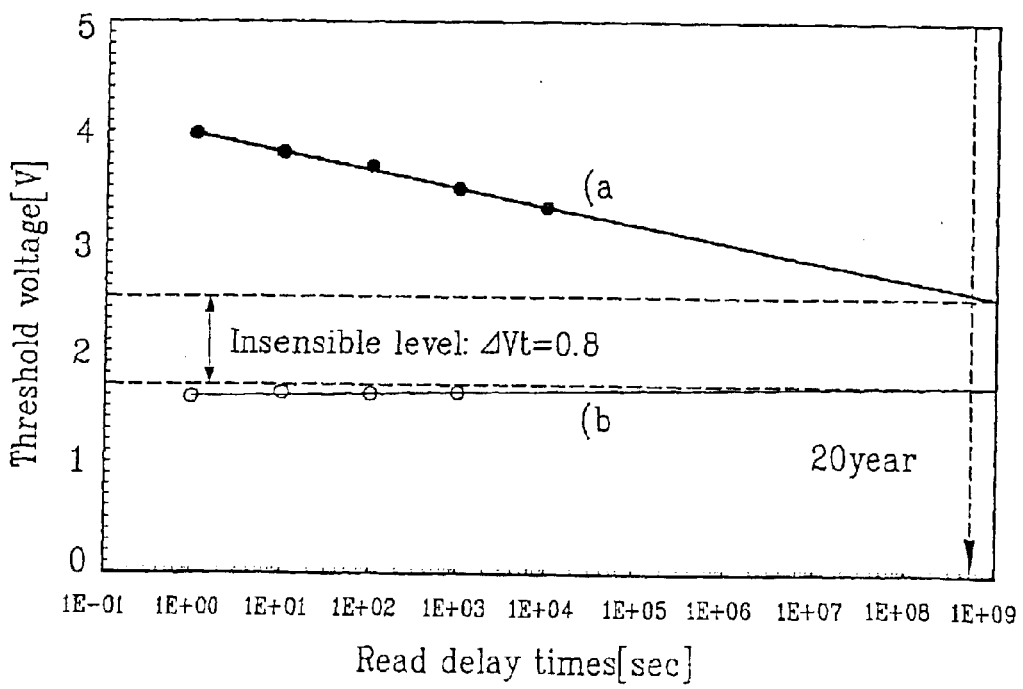
FIG. 10 shows a memory retaining characteristic of the flash memory cell according to the embodiment of the present invention over time.

FIG. 10 shows a memory retaining characteristic of the flash memory cell according to the embodiment of the present invention over time. In FIG. 10, the region between the dashed lines represents an insensible threshold voltage range (Vt=0.8), i.e., the cell cannot be properly read.

The programmed threshold voltage level steadily decreases over time and the erase threshold voltage level slightly increases over time. It is noted that the voltages would be sense properly even after around 20 years (1e+9 seconds). Thus, the unit cell according to the embodiment of the present invention has excellent memory retaining characteristic.

Figure 11:
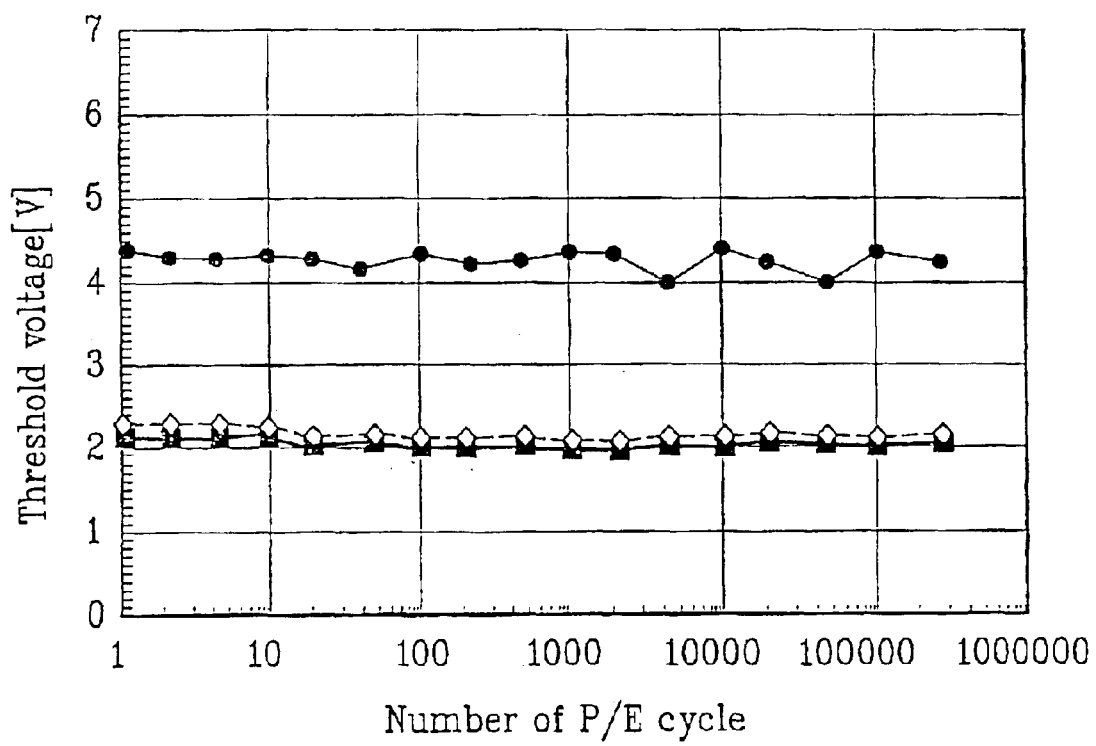
FIG. 11 shows a threshold voltage retaining characteristic of the flash memory cell according to the embodiment of the present invention over repeated programming and erasing cycles.

FIG. 11 shows a threshold voltage retaining characteristic of the flash memory cell according to the embodiment of the present invention over repeated programming and erasing cycles. A program and erase (P/E) cycle is defined as where one program operation and one erase operation are performed in sequence.

In this instance, the biasing conditions are as follows. For programming, the supply voltage Vcc of 3V is applied to the word line (for 500 $\mu$s) and the −Vpp voltage of −7V is applied to the selection line, the bit line, and the well. For erasing, the −Vpp voltage of −6V is applied to the word line (for 1 second) the supply voltage, Vcc of 3V is applied to the selection line, the bit line and the well.

It is seen that despite the numerous P/E cycles, the threshold voltage of 4V to 4.4V for the programming and about 2V for the erasing are maintained. Further, the difference of the threshold voltages is also maintained in the range of 2V to 2.4V, i.e., Vt=VP−VE≈2V to 2.4V.

Therefore, even though the number of the P/E cycles is increased, the threshold voltage is fairly constant. Thus the flash memory has excellent endurance.

The array of the flash memory cells according to the present invention described above and the data program and erase methods using the same provide the following advantages.

First, since a single transistor can be used in a unit cell, the chip area can be significantly reduced, and the cells can be more easily isolated from each other improving the integrity of the chip.

Second, programming the chip is significantly simplified.

Third, since the cell structure is simple and a CMOS fabrication process can be applied for manufacturing the cell, it is possible to mass-produce the cells according to the present invention as a stand-alone product or as an embedded product.

It will be apparent to those skilled in the art that various modifications and variations can be made in the fabrication method of the present invention without departing from the spirit or scope of the invention. Thus, it is intended that the present invention covers the modifications and variations of this invention provided they come within the scope of the appended claims and their equivalents.

What is claimed is:

1. An array of flash memory cells, comprising:

a plurality of flash memory cells arranged in a form of matrix, each of said flash memory cells having a single transistor with a MONOS/SONOS structure, wherein the single transistor includes:

a gate formed over a semiconductor substrate;

a source and a drain formed in said semiconductor substrate at edges of said gate; and a bottom silicon oxynitride film, a middle silicon oxynitride film and a top silicon oxynitride film stacked between said gate and said semiconductor substrate, wherein nitrogen concentration of said middle silicon oxynitride film is higher than those of the bottom silicon oxynitride film and said top silicon oxynitride film;

a plurality of word lines arranged in a one line direction so that said gates of said flash memory cells arranged in a row are commonly connected;

a plurality of selection lines arranged in the direction perpendicular to said word lines so that said sources of said flash memory cells arranged in a column are commonly connected; and a plurality of bit lines arranged in a direction parallel to said selection lines so that said drains of said flash memory cells arranged in said column are commonly connected.

2. The array of flash memory cells claimed in claim 1, wherein said array of said flash memory cells is arranged in NOR type.

3. The array of flash memory cells claimed in claim 1, wherein said flash memory cell is a flash EEPROM.

4. A method to program an array of flash memory cells having a plurality of word lines, selection lines and bit lines respectively connected to each of gate, source and drain of a plurality of flash memory cells arranged in the form of a matrix and a well formed in each memory cell and wherein each memory cell comprises a single transistor including a bottom silicon oxynitride film, a middle silicon oxynitride film and a top silicon oxynitride film stacked between said gate and a semiconductor substrate, wherein nitrogen concentration of said middle silicon oxynitride film is higher than those of the bottom silicon oxynitride film and said top silicon oxynitride film, the method comprising:

a) selecting a cell among said plurality of flash memory cells;

b) applying a supply voltage Vcc to a word line connected to the gate of said selected cell;

c) applying a voltage −Vpp to the selection lines and the bit line connected to the source and drain of said selected cell, wherein the absolute value of the voltage −Vpp is larger than that of the supply voltage Vcc;

d) applying said voltage −Vpp to said well of said selected cell;

e) applying a ground voltage to the selection lines and bit lines on the same row as said selected cell; and f) applying said ground voltage to the word lines of the cells not connected to the same word line as said selected cell.

5. The method as in claim 4, wherein steps b), c), d), e), and f) occur simultaneously.

6. A method to erase an array of flash memory cells having a plurality of word lines, selection lines and bit lines connected to each of gate, source and drain of the plurality of flash memory cells arranged in a form of matrix and a well formed in each memory cell, wherein each flash memory cell includes a bottom silicon oxynitride film, a middle silicon oxynitride film and a top silicon oxynitride film stacked between said gate and a semiconductor substrate, wherein nitrogen concentration of said middle silicon oxynitride film is higher than those of the bottom silicon oxynitride film and said top silicon oxynitride film, the method comprising:

a) selecting a block of cells to erase;

b) applying a voltage −Vpp to the word lines of said block of cells; and c) applying a supply voltage Vcc to the selection lines, the bit lines and the wells of said block of cells, wherein the absolute value of the supply voltage vcc is smaller than that of the voltage −Vpp.

7. The method of claim 6, wherein steps b) and c) occur simultaneously.

* * * * *